United States Patent [19]
Lee et al.

[11] Patent Number: 5,907,514
[45] Date of Patent: May 25, 1999

[54] CIRCUIT AND METHOD FOR CONTROLLING A REDUNDANT MEMORY CELL IN AN INTEGRATED MEMORY CIRCUIT

[75] Inventors: Jae-woong Lee, Seoul; Jei-hwan Yoo, Kyungki-do, both of Rep. of Korea

[73] Assignee: Samsung Electronics, Co., Ltd., Suwon-city, Rep. of Korea

[21] Appl. No.: 09/058,053

[22] Filed: Apr. 9, 1998

[30] Foreign Application Priority Data

Apr. 10, 1997 [KR]  Rep. of Korea ....................... 97-13215

[51] Int. Cl.$^6$ ........................................................ G11C 7/00
[52] U.S. Cl. .................... 365/200; 365/201; 365/203; 365/225.7; 365/194
[58] Field of Search ................................... 365/200, 201, 365/225.7, 194, 203

[56] References Cited

U.S. PATENT DOCUMENTS 5,732,032  3/1998  Park et al. ............................... 365/201

Primary Examiner—Vu A. Le
Attorney, Agent, or Firm—Marger Johnson & McCollom, P.C.

[57] ABSTRACT

A circuit and method are shown for controlling a redundant memory cell of an integrated memory circuit. The circuit includes a decoder, a precharge enable unit, a redundant controller, a redundant enable signal generator, and a redundant memory cell array. The precharge enable unit is connected to the decoder, and responds to a precharge enable signal by precharging the output terminal of decoder. The decoder responds to a first row address signal by discharging the output terminal of the decoder unless the value of the row address signal corresponds to a programmed address of the decoder. The redundant enable signal generator samples the voltage level of the output terminal of the decoder under control of a redundant control signal of the redundant controller in order to generate a redundant cell enable signal. The redundant controller generates the redundant control signal in response to a second row address signal, where the redundant controller delays the redundant control signal by a predetermined time interval in response to a stress test signal which is active during a stress test in order to allow the decoder sufficient time to discharge the output terminal during the stress test. The redundant memory cell array is connected to the redundant enable signal generator and responds to the redundant enable signal.

11 Claims, 9 Drawing Sheets

CIRCUIT AND METHOD FOR CONTROLLING A REDUNDANT MEMORY CELL IN AN INTEGRATED MEMORY CIRCUIT

BACKGROUND OF THE INVENTION

1. Field of the Invention

The present invention relates to an integrated memory circuit and, more particularly, to a circuit and method for controlling a redundant memory cell during a burn-in stress test.

2. Description of the Related Art

Integrated memory circuits typically include a plurality of memory cells for storing data. A typical integrated memory circuit has capacity of 64 megabits (MBits). However, when one or more memory cells are defective, the integrated memory circuit cannot be used, which reduces manufacturing yield and thereby increases cost. In order to increase yield, integrated memory circuits usually include redundant memory cells. When a normal memory cell is defective, then it is replaced with a redundant memory cell, which allows the device to be used despite the defective memory cell and results in increased yield.

When an integrated memory circuit having redundant memory cells is subjected to a burn-in stress test, then a problem can arise wherein normal memory cells are mistakenly identified as defective and replaced with redundant memory cells. As a result, normal memory cells may be excluded from the burn-in stress test.

FIG. 1 is a circuit diagram of a conventional redundant memory cell control circuit for an integrated memory circuit. Referring to FIG. 1, the redundant memory cell control circuit includes a precharge enable unit 11, a decoder 13, a redundant controller 15 and a redundant enable signal generator 17. A redundant memory cell array 19 is connected to an output terminal of the redundant enable signal generator 17.

The precharge enable unit 11 is composed of a PMOS transistor coupled between a power supply terminal Vcc and a node N1. The gate of the PMOS transistor is driven by a precharge enable signal PPRE. When PPRE is active, the precharge enable unit 11 precharges node N1 to the voltage level of the power supply terminal Vcc. The voltage at the power supply terminal Vcc is typically 3.3 V during either a read or a write operation and is stressed to 5.5 V during a burn-in stress test.

The decoder 13 includes a series of fuses $F1$-$F_{2n+2}$ coupled between node N1 and NMOS transistors $M1$-$M_{2n+2}$. Each of the NMOS transistors $M1$-$M_{2n+2}$ is coupled between one of the fuses $F1$-$F_{2n+2}$ and a ground supply terminal GND and has its gate driven by one of a number of logic level of row address signals RAi/RAiB (i=0, 1, 2 . . . ).

The redundant controller 15 includes a NAND gate 31 and three invertors 33, 34 and 35 connected in series. Each of the inputs to NAND gate 31 receives one of the row address signals RAi-RAiB and generates a redundant control signal PREDE.

The redundant enable signal generator 17 includes a NAND gate 41 and an invertor 43. One input of NAND gate 41 receives the voltage at the node N1 and the other input of NAND gate 41 receives the redundant control signal PREDE which are logically combined in order to generate a redundant cell enable signal RED.

The redundant memory cell array 19 is enabled by the redundant cell enable signal RED. That is, when the redundant cell enable signal RED is logic high, the redundant memory cell array 19 is activated, and when logic low, the redundant memory cell array 19 is inactivated.

In the operation of the redundant memory cell control circuit of FIG. 1, when one of the normal memory cells (not shown) is defective, e.g. the memory cell connected to a row address RA0 is defective, then fuse F1 is cut. During the burn-in stress test, the precharge enable signal PPRE is activated to a logic low level and the precharge enable unit 11 precharges node N1 to the voltage level of power supply terminal Vcc, which is typically 5.5 V. When the node N1 is precharged and the row address signal RA0 is activated to a logic high level, the NMOS transistor M1 becomes active. However, because fuse F1 is cut, node N1 does not discharge and node N1 remains precharged to a high logic state. At this time, the redundant controller 15 generates the redundant control signal PREDE which is active at a logic high level. Accordingly, both inputs to NAND 41 of redundant enable signal generator 17 are at a logic high level and the redundant cell enable signal RED from the redundant enable signal generator 17 is activated to a logic high level and activates the redundant memory cell array 19. In this manner, the defective memory cell corresponding to the row address signal is replaced with the redundant memory cell array 19.

When the node N1 is precharged and the row address RA0 becomes inactive, then a row address RA0B becomes logic high level and node N1 is discharged. At this time, the redundant controller 15 will also generate the redundant control signal PREDE, but node N1 is discharged and the redundant cell enable signal RED will remain at a logic low level. When the redundant cell enable signal RED is inactivate, the redundant memory cell array 19 also remains inactivate.

However, the discharging speed of node N1 can be relatively slow, as illustrated in FIG. 2 (see FIG. 2A). This is because the precharged voltage at node N1 is at a higher level, 5.5 V, than the normal operating voltage, 3.3 V. Consequently, when the redundant control signal PREDE is activated at a logic high at a point P1 of FIG. 2 when the voltage at the node N1 has not sufficiently discharged, then the redundant cell enable signal RED will become a logic high and activate the redundant memory cell array 19. When the redundant memory cell array 19 is mistakenly activated due to the higher burn-in test voltage, a memory cell having no defect will be excluded from the burn-in stress test and may be defective. Thus, the reliability of the integrated memory circuit is reduced.

SUMMARY OF THE INVENTION

Accordingly, it is an object of the present invention to provide a redundant memory cell control circuit for an integrated memory circuit which accurately controls operation of the redundant memory cell during a burn-in stress test.

To accomplish the object of the present invention, an embodiment of a redundant memory cell control circuit, according to the present invention, includes a decoder that receives a first set of row address signals and, responsive thereto, discharges an output terminal of the decoder and a precharge enable unit that precharges the output terminal of the decoder responsive to a precharge enable signal. A redundant controller receives a second set of row address signals and a stress signal and generates a redundant control signal using a first enable path responsive to the second set of row address signals when the stress signal is absent and generates the redundant control signal using a second enable path responsive to the second set of row address signals when the stress signal is present such that the redundant control signal is generated after a predetermined delay when the stress signal is present. A redundant enable signal generator generates a redundant enable signal in response to the redundant control signal and a voltage level at the output terminal of the decoder.

An embodiment of a method for controlling a redundant memory cell in an integrated memory circuit, according to the present invention, includes precharging a circuit node responsive to a precharging signal, discharging the circuit node responsive to a first set of row address signals, generating a redundancy control signal responsive to a second set of row address signals, and sampling a logic level of the circuit node responsive to the redundancy control signal in order to generate a redundant memory cell enable signal. The method also includes delaying the redundancy control signal by a predetermined time interval responsive to a test signal.

Another embodiment of a redundant memory cell controller circuit for an integrated memory cell device including a redundant memory cell, according to the present invention, includes a precharge enable unit having first, second and control terminals, where the control terminal of the precharge enable unit receives a precharge enable signal, the first terminal is coupled to a first power supply terminal and the second terminal of the precharge enable unit is coupled to a circuit node. The redundant memory cell controller circuit includes a decoder having a plurality of address input terminals that receive a first plurality of row address signals and an output terminal that is coupled to the circuit node, where the decoder is programmable to discharge a voltage at the output terminal responsive to a first set of values of the first plurality of row address signals and to maintain the voltage at the output terminal responsive to a predetermined value of the first plurality of row address signals. A redundant controller is included having a plurality of address input terminals that receive a second plurality of row address signals, a test control input terminal that receives a stress test signal, and an output terminal, where the redundant controller generates a redundant control signal at the output terminal of the redundant controller responsive to the second plurality of row address signals and the redundant control signal is delayed by a predetermined time interval responsive to the stress test signal. A redundant enable signal generator is also included which has first and second input terminals and an output terminal, where the first input terminal is coupled to the circuit node and the second input terminal is coupled to the output terminal of the redundant controller. The redundant enable signal generator is configured to sample a voltage of the circuit node responsive to the redundant control signal in order to generate a redundant memory cell enable signal at the output terminal of the redundant enable signal generator.

An advantage of the circuits and method for controlling a redundant memory cell circuit according to the present invention is that the operation of the redundant memory cell is accurately controlled during a burn-in stress test in order to enhance the reliability of the integrated memory circuit which includes the redundant memory cell circuit.

BRIEF DESCRIPTION OF THE DRAWINGS

The above object and advantage of the present invention will become more apparent by describing in detail a preferred embodiment thereof with reference to the attached drawings in which.

DESCRIPTION OF THE PREFERRED EMBODIMENT

Figure 1:
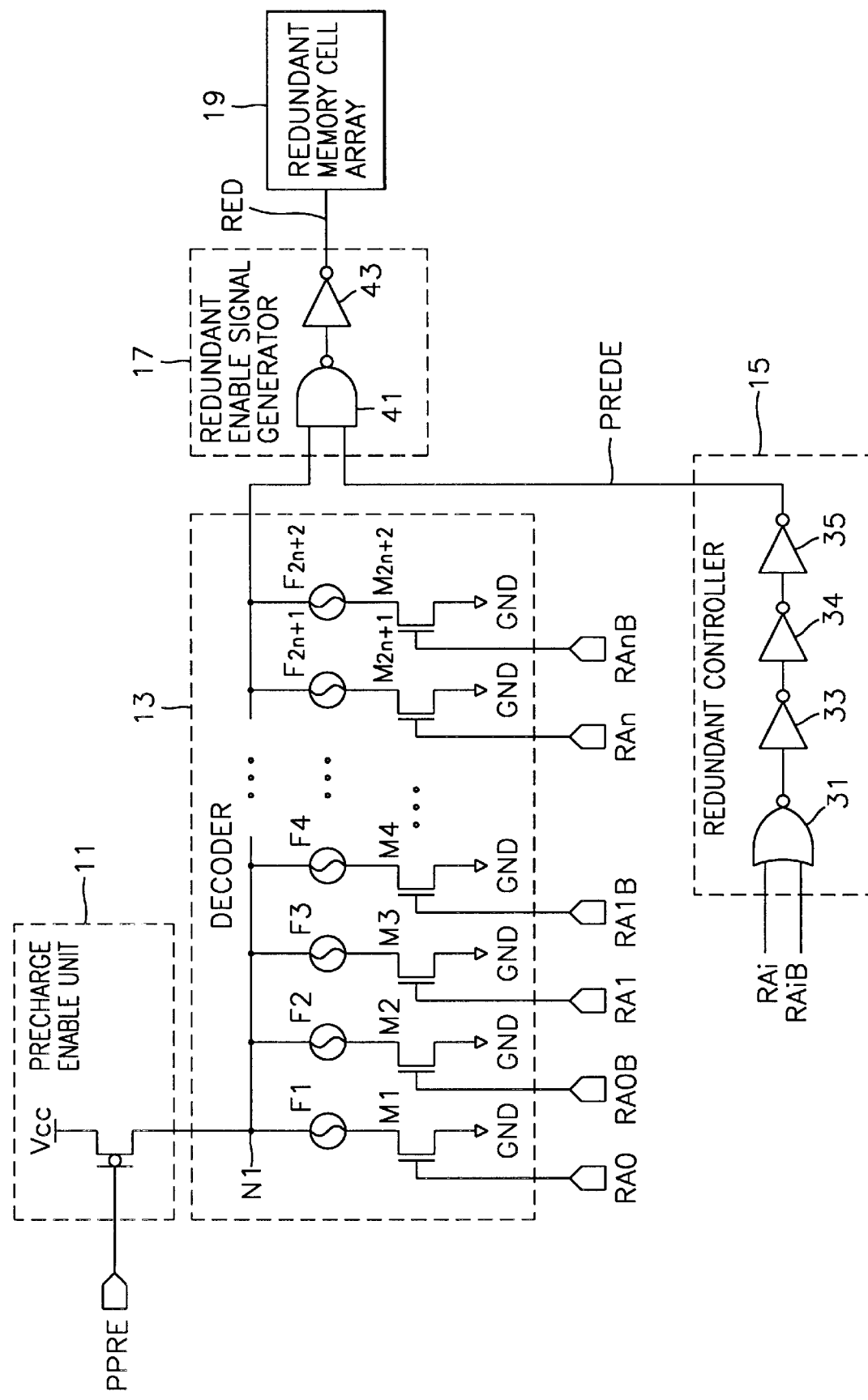
FIG. 1 is a circuit diagram of a conventional redundant memory cell control circuit for an integrated memory circuit.
Figure 2:
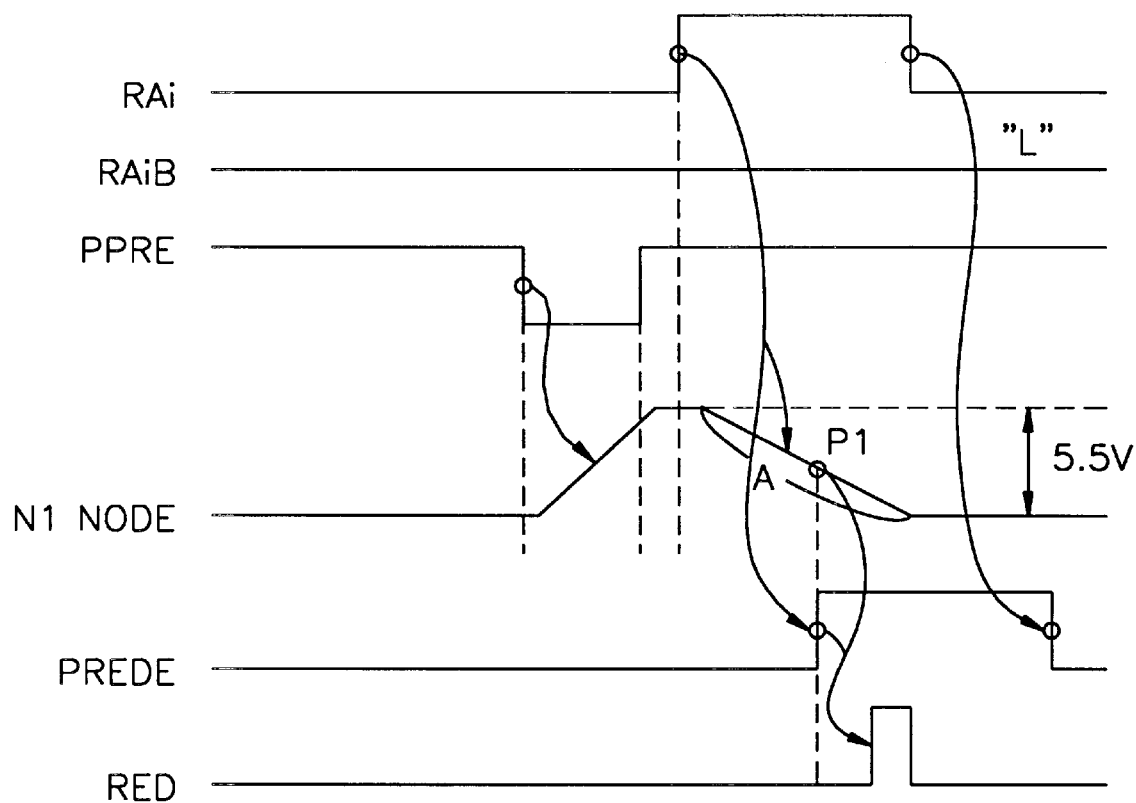
FIG. 2 is a timing diagram illustrating the operation during burn-in mode of the conventional redundant memory cell control circuit of FIG. 1.
Figure 3:
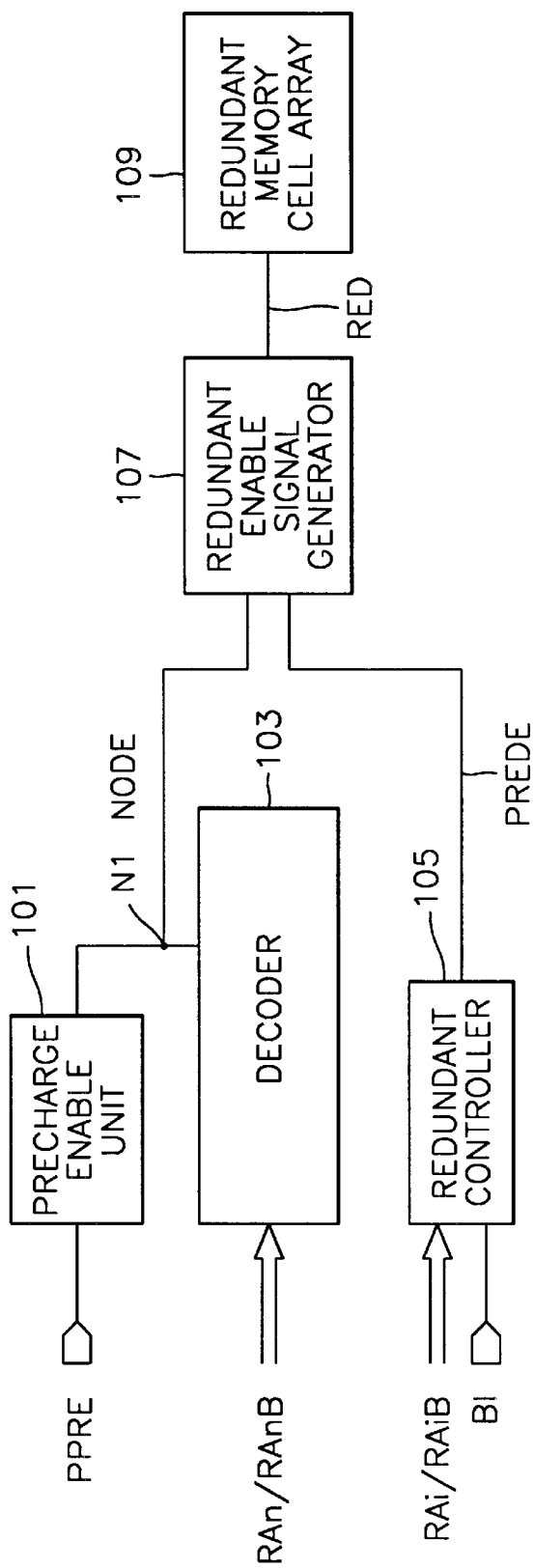
FIG. 3 is a block diagram of a redundant memory cell control circuit for an integrated memory circuit according to the present invention.

FIG. 3 illustrates a redundant memory cell control circuit according to the present invention which includes a precharge enable unit 101, a decoder 103, a redundant controller 105, and a redundant enable signal generator 107. A redundant memory cell array 109 is connected to an output terminal of the redundant enable signal generator 107.

The precharge enable unit 101 responds to a precharge enable signal PPRE. That is, when the precharge enable signal PPRE becomes active at a logic low level, then the precharge enable unit 101 precharges node N1 at an output terminal of the precharge enable unit.

The decoder 103 determines a voltage level of the node N1 in response to the row address value input via row address signal lines RAn/RAnB, where n=0, 1, 2, . . . .

The redundant controller 105 generates a redundant control signal PREDE, in response to the row address signal line RAi/RAiB, where i=0, 1, 2, . . . , and a burn-in signal BI. That is, when either of the row address signal lines RAi or RAiB is active, then the redundant control signal PREDE is active.

The redundant enable signal generator 107 generates a redundant cell enable signal RED in response to the voltage level at the node N1 and the redundant control signal PREDE. That is, when the redundant control signal PREDE is active at a logic high and the node N1 is also precharged to a logic high, then the redundant cell enable signal RED becomes active at a logic high and the redundant memory cell array 109 is activated. When the redundant control signal PREDE is active at a logic high but the node N1 is discharged, then the redundant cell enable signal RED is inactive at a logic low and the redundant memory cell array 109 remains deactivated. The redundant memory cell array 109 should only be active when the normal memory cell array row connected to the row address signal RAi/RAiB, where i=0, 1, 2, . . . , has defective memory cells which are replaced by a row in the redundant cell array 109. When there are no defective cells in the normal memory cell array, then redundant memory cell array 109 should remain in an inactive state.

The redundant controller 105 shown in FIG. 3 controls the operation of the redundant enable signal generator 107 such that the redundant enable signal generator 107 will operate during the burn-in stress test whether the node N1 is precharged or discharged. The voltage at power supply terminal Vcc used for the burn-in stress test is higher than the power supply voltage used during a normal read or write operation. As a result, the precharged voltage level of the node N1 during the burn-in stress test is higher than voltage level at node N1 during a read or write. Thus, when the node N1 is precharged and then discharged during the burn-in stress test, a longer period of time is required for discharging the higher voltage level at N1 than the time required for discharging during a read or write operation.

The redundant controller 105 activates the redundant control signal PREDE responsive to the row address signal lines RAi/RAiB and after a predetermined time delay. The predetermined time delay is such that there will be sufficient time, during a burn-in stress test, for the node N1 to fully discharge. As a result, by the time that the PREDE signal is received, the voltage at node N1 will be accurate and the redundant cell enable signal RED generated by the redundant enable signal generator 107 will be a valid value that correctly drives the redundant memory cell array 109. Accordingly, the burn-in stress test is accurately performed and the reliability of the integrated memory circuit is improved.

Figure 4:
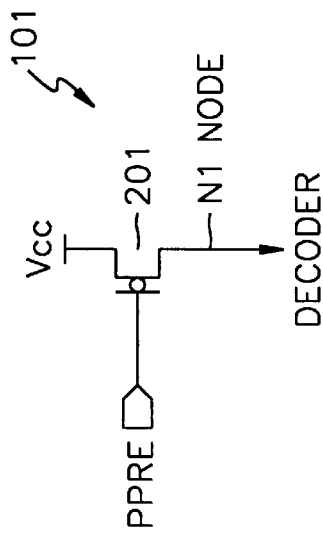
FIG. 4 is a circuit diagram of the precharge enable unit of FIG. 3.

FIG. 4 is a circuit diagram of the precharge enable unit 101 of FIG. 3. Referring to FIG. 4, the precharge enable unit 101 includes a PMOS transistor 201 having a gate where a precharge enable signal PPRE is applied, a source coupled to power supply terminal Vcc, and a drain connected to the node N1. The PMOS transistor 201 precharges the node N1 to the voltage level at the power supply terminal Vcc when the precharge enable signal PPRE is active at a logic low. In general, the voltage at the power supply terminal is 3.3 V for read or write operations and is 5.5 V for the burn-in stress test.

Figure 5:
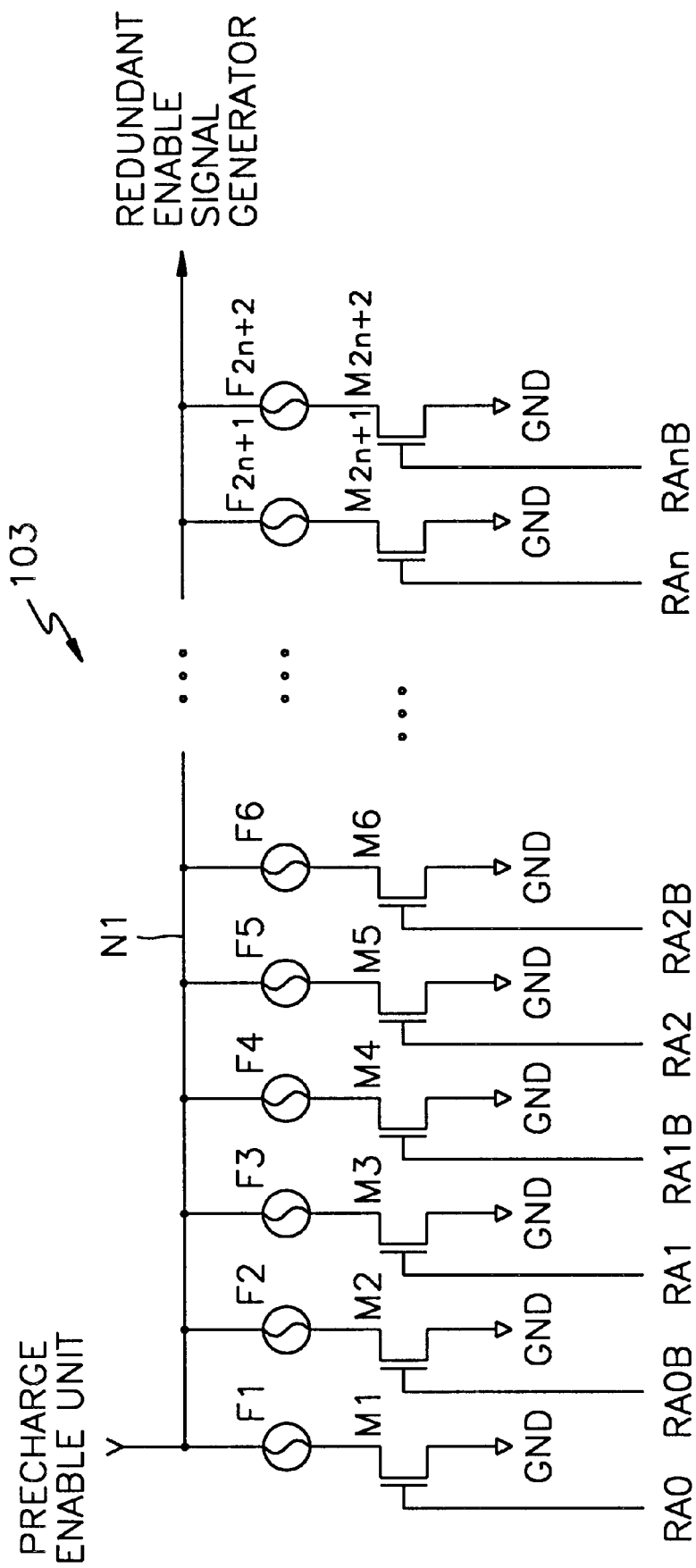
FIG. 5 is a circuit diagram of the decoder of FIG. 3.

FIG. 5 is a circuit diagram of the decoder 103 of FIG. 3. Referring to FIG. 5, the decoder 103 includes a plurality of fuses $F1-F_{2n+2}$, each having one end connected to the node N1, and NMOS transistors $M1-M_{2n+2}$, the number of which corresponds to the number of the fuses $F1-F_{2n+2}$, connected to each of the other end of the fuses $F1-F_{2+2}$. Each of the row address signal lines RAi/RAiB is applied to gates of the NMOS transistors $M1-M_{2+2}$. Accordingly, an operation state of the NMOS transistors $M1-M_{2+2}$ is determined by the logic levels of the row address signal lines RAi/RAiB, where i=0, 1, 2, . . . . For example, when the row address signal RA0 is active at a logic high, the NMOS transistor M1 becomes activated, and when the row address signal RA0 is inactive at a logic low, the NMOS transistor M1 remains deactivated. When a subset of the fuses $F1-F_{2n+2}$ are cut, for example, the fuse F1 is cut, then the NMOS transistor M1 is disconnected from the node N1. Fuses $F1-F_{2n+2}$ are laser fuses which can be cut by exposing them to a laser beam.

When one of the memory cells included in the normal memory cell array is defective, the fuses corresponding to the row address of the defective memory cell are cut. For example, when the memory cell connected to the row address signal RA0 of the memory cells included in the normal memory cell array is defective, the fuse F1 is cut. As a result of cutting a subset of fuses corresponding to the row address, the node N1 will not be discharged by the input of the row address and will remain in a precharged state. Thus, node N1 will be at a logic high which is input to the redundant enable signal generator 107 which will generate the RED signal in order to activate the redundant memory cell array 109. That is, when the row address of the defective memory cell is input, then a redundant memory cell in redundant memory cell array 109 is activated and replaces the defective memory cell.

Figure 6:
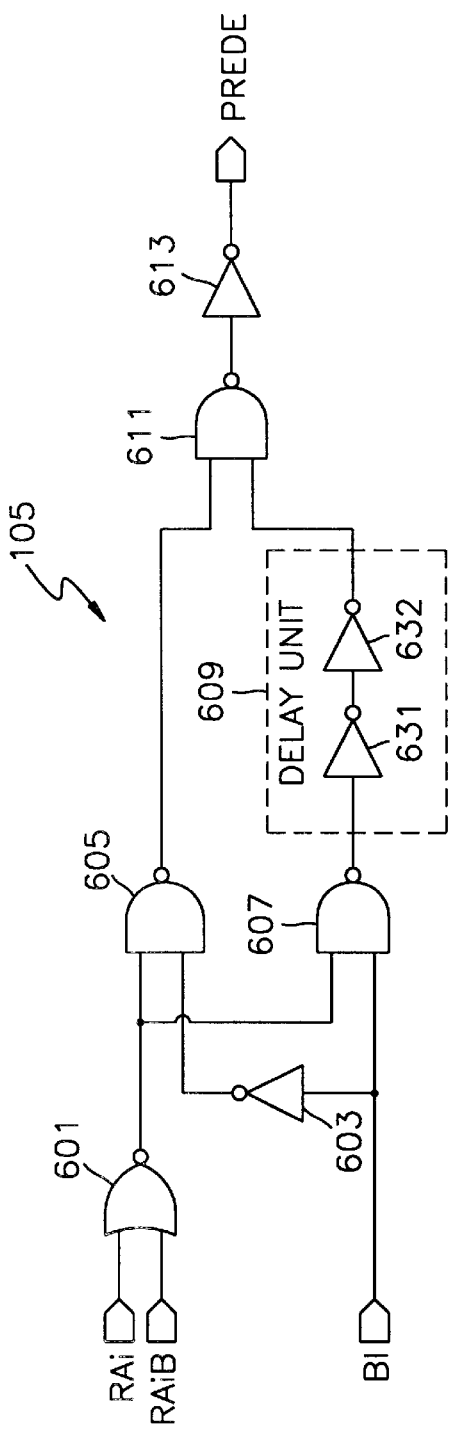
FIG. 6 is a circuit diagram of the redundant controller of FIG. 3 according to one embodiment of the present invention.

FIG. 6 is a circuit diagram of the redundant controller 105 of FIG. 3 according to a first embodiment of the present invention. Referring to FIG. 6, the redundant controller 105 includes a NOR gate 601, NAND gates 605, 607 and 611, invertors 603 and 613, and a delay unit 609.

The NOR gate 601 receives row address signal lines RAi/RAiB. When at least one of the row address signals is at a logic high, then the NOR gate 601 will generate a signal at a logic low level, and when the two signals are logic low, a signal of a logic high level is generated by NOR gate 601.

The invertor 603 receives and inverts a burn-in signal BI, the inverted burn-in signal being input to NAND gate 605. The NAND gate 605 also receives the output of the NOR gate 601. When either the output of NOR gate 601 or the output of invertor 603 is at a logic low, then NAND gate 605 generates a signal of logic high, and when the two inputs to NAND gate 605 are logic high, then a signal of logic low is generated.

The NAND gate 607 receives the output of NOR gate 601 and the burn-in signal BI. When either the output of NOR gate 601 or the burn-in signal BI is at a logic low, then the NAND gate 607 generates a signal at a logic high, and when both inputs are at a logic high, then NAND gate 607 generates a signal of logic low.

The delay unit 609 includes two invertors 631 and 632. The invertor 631 receives and inverts the output signal of the NAND gate 607. The invertor 632 receives and inverts the output signal of the invertor 631. While passing through the delay unit 609, the output signal of the NAND gate 607 is delayed by a predetermined period without changing the phase of the signal. The NAND gate 611 receives the output signal of the NAND gate 605 and the output signal of the delay unit 609 and, responsive thereto, generates an output signal that is inverted by invertor 613 to produce the redundant control signal PREDE. When either one of the inputs to NAND gate 611 is at a logic low, then PREDE is at a logic low and when both inputs are logic high, then PREDE is activated at a logic high.

When row address signal lines RAi/RAiB are activated at the same time that the burn-in signal BI is active at a logic high, then the redundant controller 105 of FIG. 6 will delay the activation of the PREDE signal for a predetermined period. That is, when either of the row address signal lines RAi/RAiB is active at a logic high when the burn-in signal BI is active at a logic high, then the redundant control signal PREDE transitions to a logic high after a predetermined period. When both the row address signal lines RAi/RAiB are inactive at a logic low, then the redundant control signal PREDE remains inactive. The signal output from the NAND gate 607 requires the predetermined period of time to pass through the invertors 631 and 632 of delay unit 609.

Figure 7:
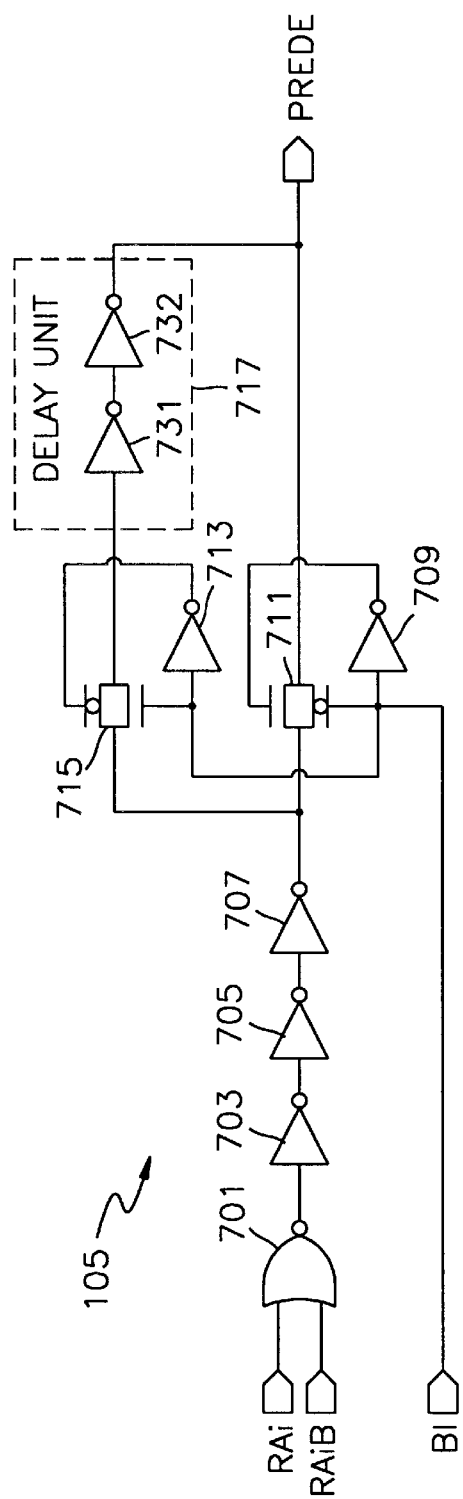
FIG. 7 is a circuit diagram of the redundant controller of FIG. 3 according to a second embodiment of the present invention.

FIG. 7 is a circuit diagram of a second embodiment of the redundant controller 105 of FIG. 3 according to the present invention. Referring to FIG. 7, the redundant controller 105 includes a NOR gate 701, invertors 703, 705, 707, 709 and 713, transmission gates 711 and 715, and a delay unit 717.

The NOR gate 701 receives and performs a NOR operation on row address signal lines RAi/RAiB at its inputs. When either one of the row address signal lines RAi/RAiB is at a logic high, then the NOR gate 701 generates an active logic low output signal. When both row address lines are logic low, the NOR gate 701 outputs an inactive logic high signal. invertors 703, 705 and 707 receive and invert the output of the NOR gate 701.

Invertors 709 and 713 each receive and invert the burn-in signal BI which is used to control transmission gates 711 and 715. Transmission gate 711 receives the BI signal at its inverting control terminal and receives the inverted BI signal output by invertor 709 at its non-inverting control terminal. Transmission gate 715 receives the BI signal at its non-inverting control terminal and receives the inverted BI signal output by invertor 713 at its inverting control terminal. The transmission gates 711 and 715 both receive the output of the invertor 707 at their respective inputs. The output of transmission gate 715 is coupled to delay unit 717, while the output of transmission gate 711 is directly connected to the output of redundant controller 105 to produce the PREDE signal.

When the burn-in signal BI is inactive at a logic low, the transmission gate 711 is activated to directly transfer the output of invertor 707 to the output of redundant controller 105. When the burn-in signal BI is active at a logic high, the transmission gate 711 is deactivated and transmission gate 715 is activated in order to route the output of the invertor 707 through delay unit 717 which generates a delayed PREDE signal.

The delay unit 717 includes two invertors 731 and 732. The invertor 731 receives and inverts the output of the transmission gate 715. The invertor 732 receives and inverts the output of the invertor 731. The output signal of the transmission gate 715 is delayed by a predetermined period of time as it passes through delay unit 717 to the output of redundant controller 105 without changing the phase of the output signal.

When row address signal lines RAi/RAiB are active at the same time that the burn-in signal BI is active at a logic high, then the redundant controller of FIG. 7 delays the row address signal lines for a predetermined period. That is, when one of the row address signal lines RAi/RAiB is active when the burn-in signal BI is active at a logic high, then redundant control signal PREDE will become active at a logic high after a predetermined delay. When the row address signal lines RAi/RAiB are inactive at a logic low, then the redundant control signal PREDE remains inactive.

Figure 8:
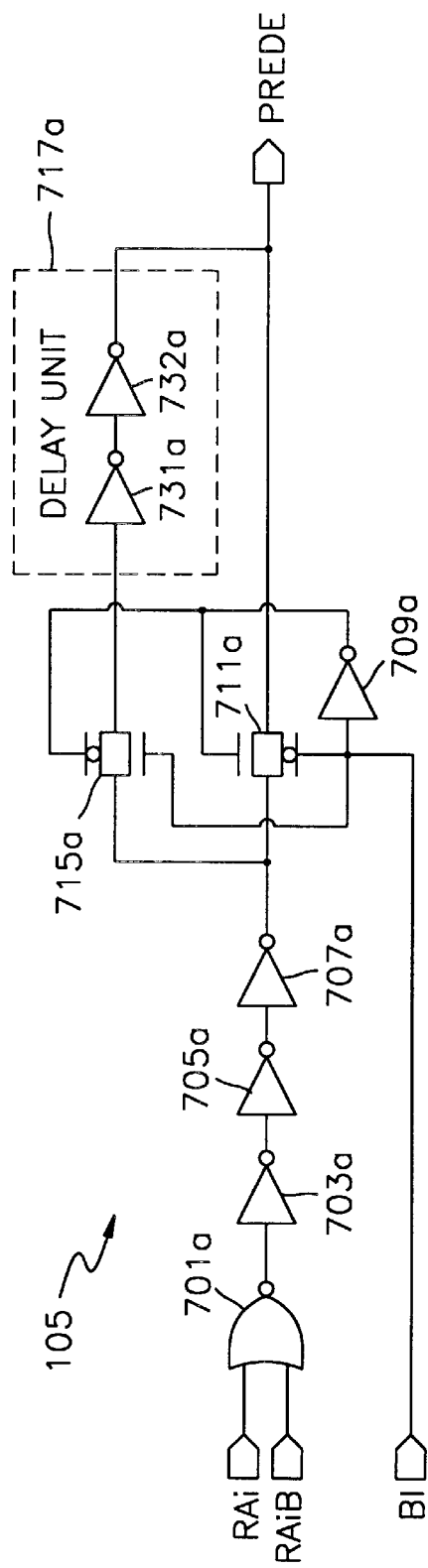
FIG. 8 is a circuit diagram of the redundant controller of FIG. 3 according to a third embodiment of the present invention.

FIG. 8 is a circuit diagram of a third embodiment of the redundant controller 105 of FIG. 3 according to present invention. The embodiment of a redundant controller 105 illustrated in FIG. 8 is similar to the embodiment of a redundant controller 105 illustrated in FIG. 7 except that the invertor 713 has been eliminated. Therefore, the circuit of FIG. 8 has a smaller area than the circuit of FIG. 7. The operation of the circuit of FIG. 8 is the same as the function of FIG. 7. When row address signal lines RAi/RAiB are active at the same time that the burn-in signal BI is active at a logic high, then the redundant controller 105 of FIG. 8 will delay the PREDE signal for a predetermined period. That is, when either of the row address signal lines RAi/RAiB is active when the burn-in signal BI is active at a logic high, then the redundant control signal PREDE will become active at a logic high after a delay determined by delay unit 807. When the row address signal lines RAi/RAiB are inactive at a logic low, then the redundant control signal PREDE is inactive.

Figure 9:
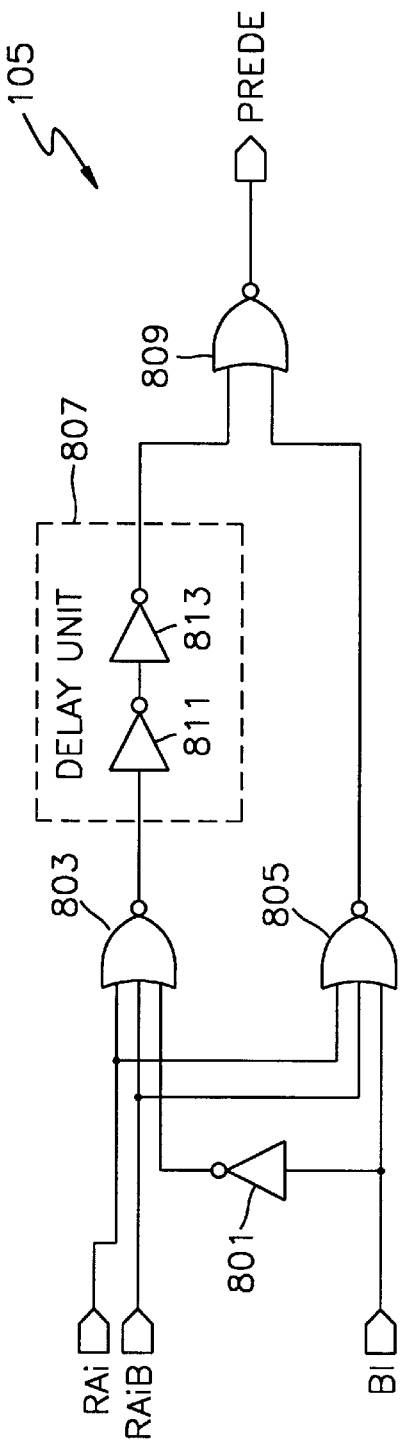
FIG. 9 is a circuit diagram of the redundant controller of FIG. 3 according to a fourth embodiment of the present invention.

FIG. 9 is a circuit diagram of a fourth embodiment of the redundant controller 105 of FIG. 3. The redundant controller of FIG. 9 includes an invertor 801, NOR gates 803 and 805, NOR gate 809, and a delay unit 807. Invertor 801 inverts the burn-in signal BI. NOR gate 803 receives row address signal lines RAi/RAiB and the inverted BI signal output from invertor 801. When either of the row address signal lines RAi/RAiB or the inverted BI signal from invertor 801 is at a logic high, then the output of NOR gate 803 becomes active at a logic low. When both the row address signal lines RAi/RAiB and the inverted BI signal output from the invertor 801 are at a logic low, then the output of the NOR gate 803 remains inactive at a logic high.

NOR gate 805 receives row address signal lines RAi/RAiB and the burn-in signal BI. When either of the row address signal lines RAi/RAiB or the burn-in signal BI is at a logic high, then the output of the NOR gate 805 becomes active at a logic low. When both the row address signal lines RAi/RAiB and the burn-in signal BI are logic low, then the output of the NOR gate 805 remains inactive at a logic high.

The delay unit 807 delays the output of the NOR gate 803. The delay unit 807 includes two invertors 811 and 813. The invertor 811 receives and inverts the output of the NOR gate 803 while invertor 813 inverts the output of the invertor 811. NOR gate 809 receives the output of the delay unit 807 and the output of the NOR gate 805 and generates the redundant control signal PREDE. When the output of either the delay unit 807 or NOR gate 805 is at a logic high, then the redundant control signal PREDE becomes inactive at a logic low. When the output of both the delay unit 807 and NOR gate 805 are at a logic low, then the redundant control signal PREDE remains active at a logic high.

When the burn-in signal BI is active at a logic high, i.e. during a burn-in mode, then the embodiment of the redundant controller 105 illustrated in FIG. 9 receives the row address signal lines RAi/RAiB which are delayed for a predetermined period by the delay unit 807. That is, when the memory device including the redundant controller 105 is in burn-in mode and either of the row address signals RAi/RAiB is active at a logic high, then the redundant control signal PREDE becomes active at a logic high after the predetermined delay period introduced by delay unit 807. When both of the row address signal lines RAi/RAiB are inactive at a logic low, then the redundant control signal PREDE remains inactive at a logic low. The signal generated by the NOR gate 803 requires the predetermined period to pass through the invertors 811 and 813 of delay unit 807.

Figure 10:
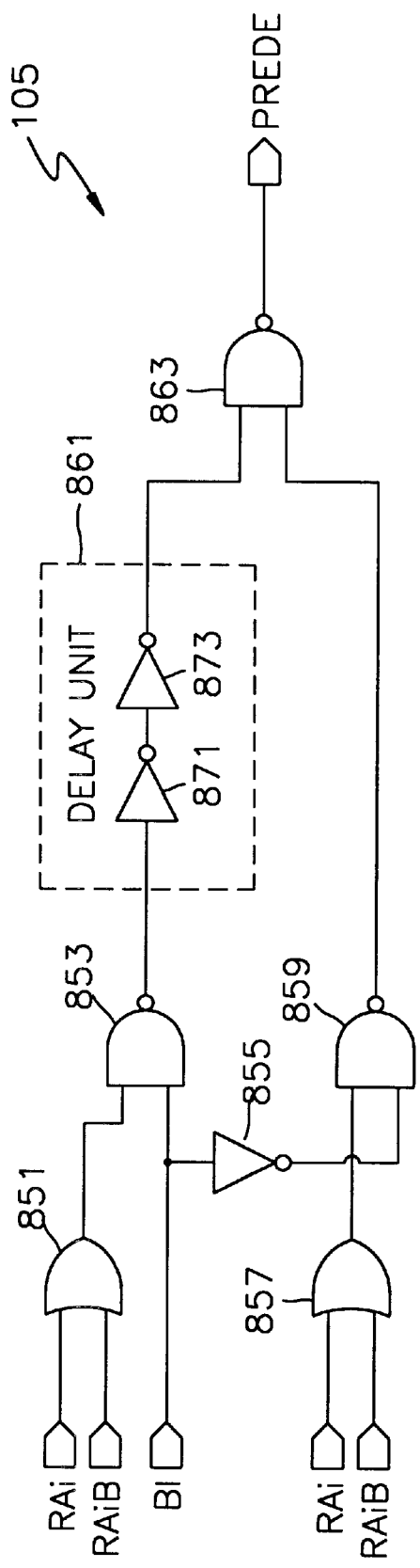
FIG. 10 is a circuit diagram of the redundant controller of FIG. 3 according to a fifth embodiment of the present invention.

FIG. 10 is a circuit diagram of a fifth embodiment of the redundant controller 105 according to the present invention. The redundant controller 105 of FIG. 10 includes an invertor 855, OR gates 851 and 857, NAND gates 853, 859 and 863, and a delay unit 861.

The invertor 855 receives and inverts the burn-in signal BI. The OR gate 851 receives row address signals RAi/RAiB. When either of the address signal lines is at a logic high, then the output of the OR gate 851 becomes active at a logic high. When both of the address signal lines RAi/

RAiB are at a logic low, then the output of the OR gate 851 remains inactive at a logic low.

The OR gate 857 also receives row address signal lines RAi/RAiB. When either of the address signals RAi/RAiB is at a logic high, then the output of the OR gate 857 becomes active at a logic high. When both of the row address signal lines RAi/RAiB are at a logic low, then the output of the OR gate 857 remains inactive at a logic low.

The NAND gate 853 receives the output of the OR gate 851 and the burn-in signal. When the output of either the OR gate 851 or the burn-in signal BI is at a logic low, then the output of the NAND gate 853 remains inactive at a logic high. When the output of both the OR gate 851 and the burn-in signal BI are both active at a logic high, then the output of the NAND gate 853 becomes active at a logic low.

The NAND gate 859 receives the output of the OR gate 857 and the inverted burn-in signal BI output by invertor 855. When either the output of the OR gate 857 or the output of invertor 855 is at a logic low, then the output of the NAND gate 859 is inactive at a logic high. When both the output of the OR gate 857 and the output of invertor 855 are at a logic high, then the output of the NAND gate 859 becomes active at a logic low.

The delay unit 861 delays the output of the NAND gate 853 for a predetermined time. The delay unit 861 includes two invertors 871 and 873. The invertor 871 inverts the output of the NAND gate 853 and the invertor 873 inverts the output of the invertor 871.

The NAND gate 863 receives the output of the delay unit 861 and the output of the NAND gate 859 in order to generate the redundant control signal PREDE. When the output of either the delay unit 861 or the output of the NAND gate 859 is at a logic low, then the redundant control signal PREDE becomes active at a logic high. When both the output of the delay unit 861 and the output of the NAND gate 859 are at a logic high, then the redundant control signal PREDE is inactive at a logic low.

When the burn-in signal BI is active at a logic high, i.e. the memory device is in a burn-in mode, and the redundant controller 105 of FIG. 10 will generate the redundant control signal PREDE after a predetermined period upon receiving an active signal on either of row address signal lines RAi/RAiB.

The operation of the embodiment of redundant controller 105 of FIG. 10 will now be described in greater detail. When a valid row address, where one of the row address signal lines RAi/RAiB is active, is applied to the OR gates 851 and 857, then the outputs of the OR gates 851 and 857 become active at a logic high. When the memory device including the redundant controller is in a burn-in mode and the outputs of the OR gates 851 and 857 are active at a logic high, then the output of the NAND gate 853 becomes active at a logic low but the output of the NAND gate 859 remains inactive at a logic high due to the inverted burn-in signal output from invertor 855. Thus the output of the delay unit 861 becomes active at a logic low after a predetermined period. The output of the NAND gate 853 is delayed by a predetermined period while passing through delay unit 861 without changing the phase of the signal. Since the output of the NAND gate 859 is forced to a logic high by the inverted burn-in signal output by invertor 855, the output of the delay unit 861 determines when the redundant control signal PREDE becomes active at a logic high.

Figure 11:
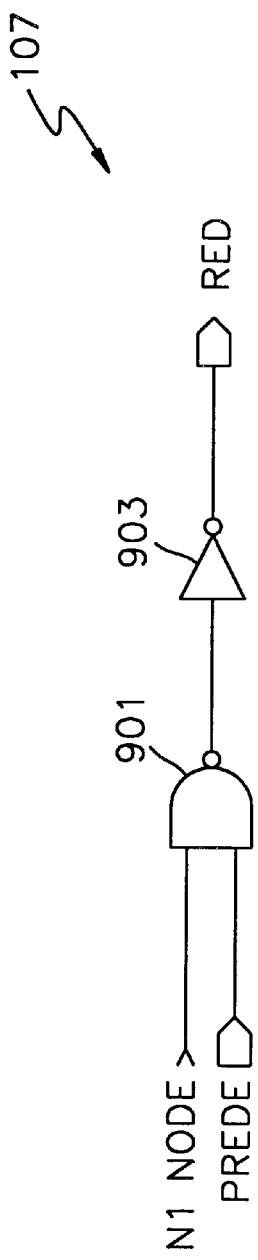
FIG. 11 is a circuit diagram of the redundant enable signal generator of FIG. 3.

FIG. 11 is a circuit diagram of an embodiment of the redundant enable signal generator 107 of FIG. 3. The redundant enable signal generator 107 of FIG. 11 includes a NAND gate 901 and an invertor 903. NAND gate 901 receives the voltage signal of the node N1 and the redundant control signal PREDE. When either the voltage of the node N1 or the redundant control signal PREDE is at a logic low, then the output of NAND 901 becomes inactive at a logic high level. When both the voltage of node N1 and the PREDE signal are at a logic high, then the output of NAND gate 901 becomes active at a logic low. Invertor 903 inverts the output of NAND gate 901 in order to generate the redundant cell enable signal RED. In redundant enable signal generator 107, when the redundant control signal PREDE is at a logic high and node N1 is not discharged, then the redundant enable signal RED becomes active at a logic high. When node N1 has been discharged, then the voltage at node N1 is at a logic low and the redundant enable signal remains inactive at a logic low.

Figure 12:
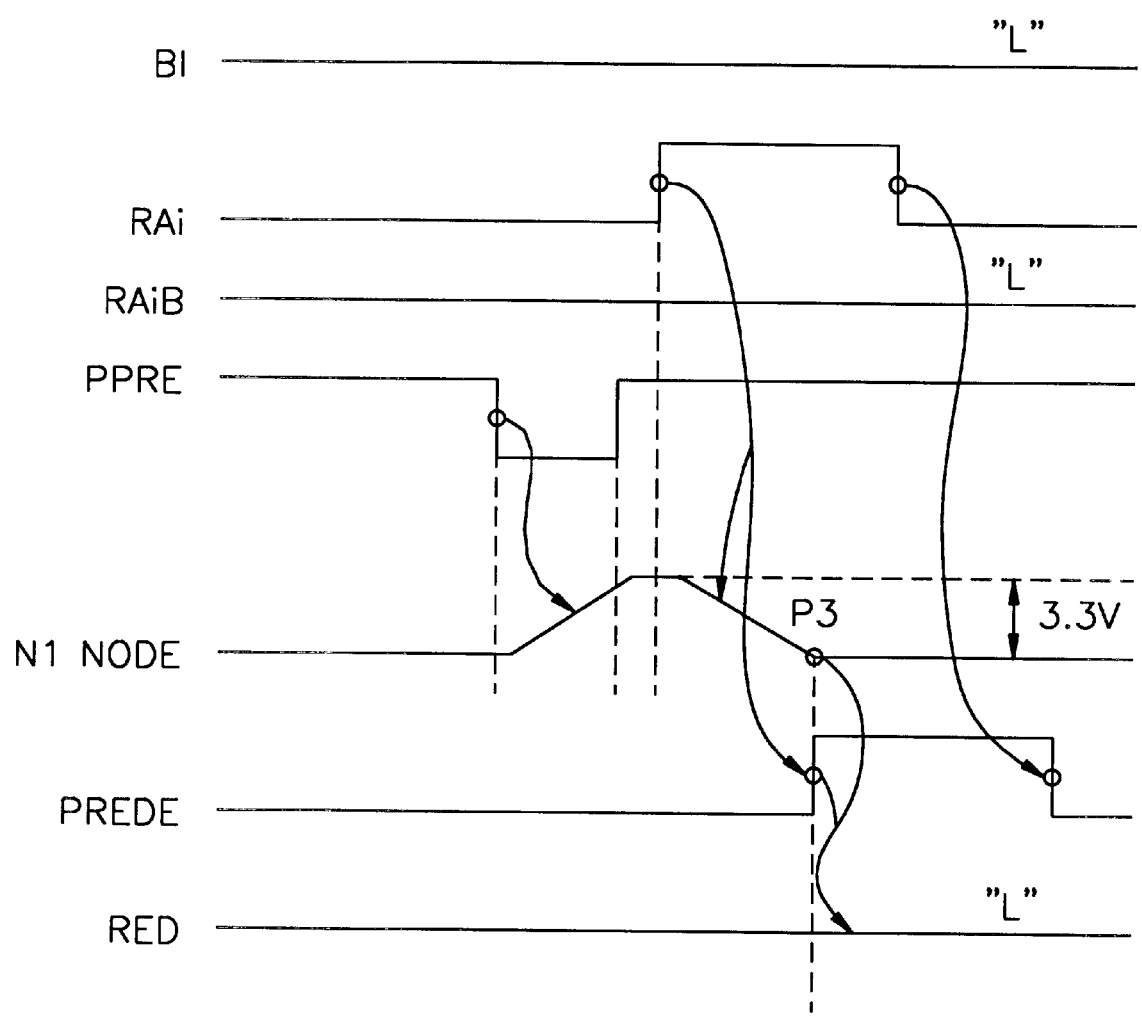
FIG. 12 is a timing diagram illustrating the operation of the redundant memory cell array of FIG. 3 during a read or write operation.

FIG. 12 is a timing diagram of the signals of the circuit of FIG. 3 during a read or write operation. The operation of the circuit of FIG. 3 during read or write will be described with reference to the timing diagram of FIG. 12 along with the circuits of FIGS. 4 through 11.

During a read or write operation, the burn-in signal BI is inactive at a logic low. When the burn-in signal BI is inactive, then the row address signal lines RAi/RAiB will not pass through the delay units 609, 717, 717a, 807 and 861 in the circuits of FIGS. 6 through 10, respectively. Therefore, when one of the row address signal lines RAi/RAiB is active at a logic high, then the redundant control signal PREDE will become active at a logic low without additional delay.

During a read or write operation, the initial state of the precharge enable signal PPRE is logic high. Then, when the precharge enable signal PPRE becomes active at a logic low, the PMOS transistor 201 of FIG. 4 is activated and node N1 is precharged to the voltage at power supply terminal Vcc, i.e. 3.3 V. At this time, if any of the row address signal lines RAn/RAnB, such as RA0, is active at a logic high, then the corresponding ones of NMOS transistors M1-M$_{2n+2}$ of FIG. 5, where transistor M1 corresponds to row address signal line RA0, are activated and discharge the voltage at node N1 to a logic low.

When the precharge voltage level at node N1 is at 3.3 V, then a relatively short period of time is required in order to discharge node N1 to a logic low before the redundant control signal PREDE of the redundant controller 105 becomes active at a logic high, as illustrated at point P3 in FIG. 12. At P3, the redundant enable signal generator 107 detects the voltage level of node N1 in order to generate the redundant enable signal RED. Therefore, when the voltage of the node N1 and the redundant control signal PREDE are logically NANDed by the NAND gate 901 of FIG. 11 at P3, then the redundant cell enable signal RED remains at a logic low to thereby disable the redundant memory cell array 109.

However, if a subset of fuses F1-F$_{2n+2}$ is cut, such as fuse F1 connected in series with transistor M1, then the voltage level at the node N1 is maintained at the precharged voltage level when the address input on row address lines RAn/RAnB corresponds to the subset of cut fuses. Since the voltage level of the node N1 and the redundant control signal PREDE are both at a logic high, then redundant enable signal generator 107 generates the redundant cell enable signal RED at a logic high level thereby activating the redundant memory cell array 109. Accordingly, the redundant memory cell array 109 replaces a defective memory cell at the address corresponding to the subset of cut fuses.

As described above, during a read or write operation, the redundant enable signal generator 107 accurately detects the voltage of the node N1 in order to correctly control the operation of the redundant memory cell array 109.

Figure 13:
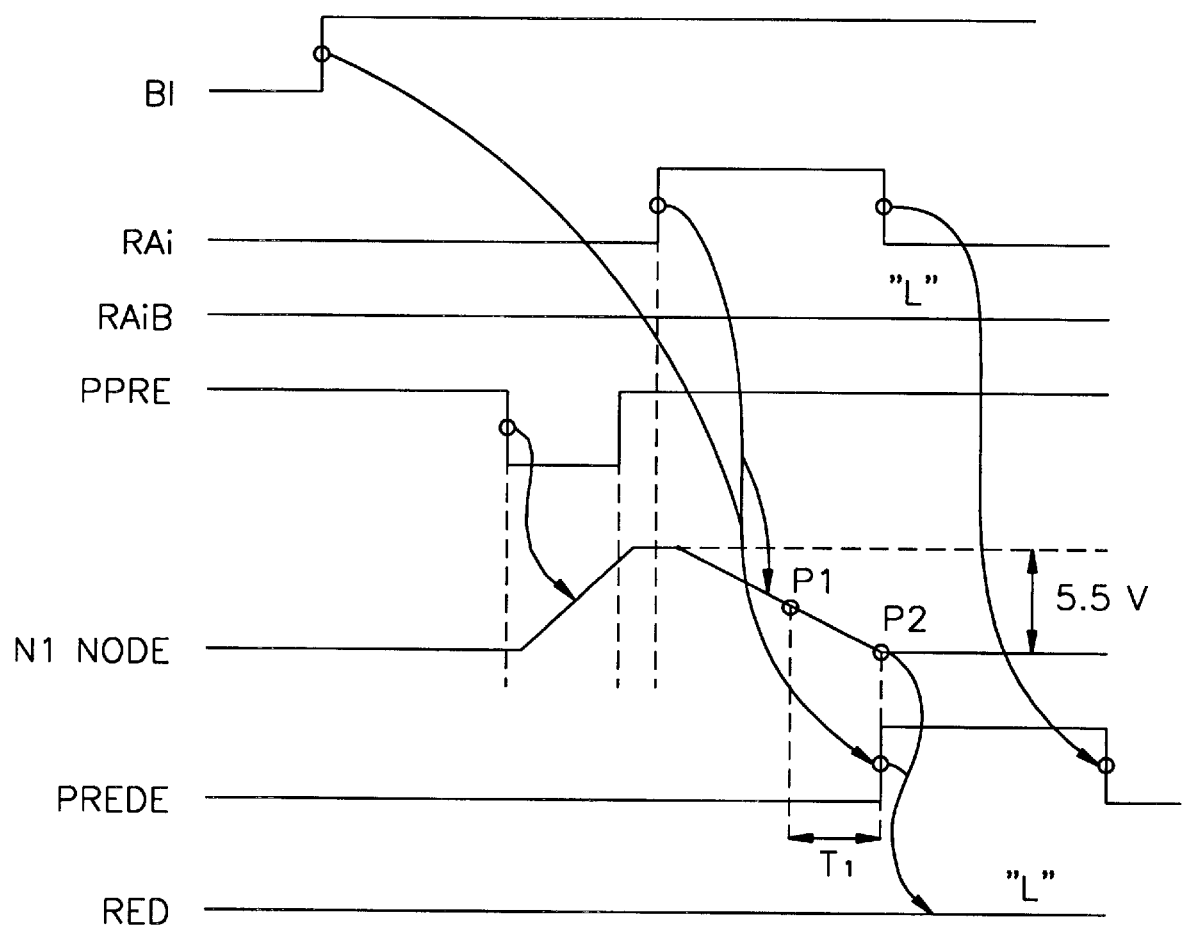
FIG. 13 is a timing diagram illustrating the operation of the redundant memory cell array of FIG. 3 during a burn-in stress test.

FIG. 13 is a timing diagram for the signals of the circuit of FIG. 3 during a burn-in operation. The operation of the circuit of FIG. 3 will be described with reference to the timing diagram of FIG. 13 along with the circuits of FIGS. 4 through 10.

During a burn-in stress test, the burn-in signal BI is active at a logic high level. When the burn-in signal BI is in an active state, row address signal lines RAi/RAiB pass through the delay units 609, 717, 717a, 807 and 861 of FIGS. 6 through 8. When one of the row address signal lines RAi/RAiB is active at a logic high, the redundant control signal PREDE becomes active at a logic high after a predetermined delay period. When all of the row address signal lines RAi/RAiB are inactive at a logic low, then the redundant control signal PREDE remains inactive at a logic low.

During an initial burn-in stress test, the precharge enable signal PPRE is logic high. When the precharge enable signal PPRE is active at a logic low, the PMOS transistor 201 of FIG. 4 is activated in order to precharge the node N1 to the voltage level present at power supply terminal Vcc during burn-in mode, i.e. 5.5 V. At this time, when a subset of the row address signal lines RAi/RAiB, such as RA0 for example, are active at a logic high, then NMOS transistor M1 of FIG. 5 is activated in order to discharge the voltage at node N1. However, the higher burn-in mode precharge voltage of 5.5 V present at node N1 is higher than the normal voltage of 3.3 V present during a read or write operation and therefore requires a longer period of time to discharge.

In the present invention, the point in time for generating the redundant control signal PREDE is delayed by T1 to compensate for the increase in time required for discharge of node N1. Thus, the point in time at which the redundant control signal PREDE becomes active at a logic high level is delayed from P1 to P2 in FIG. 13 to allow time for node N1 to be discharged to a logic low level. When the redundant control signal PREDE becomes active at a logic high, then the redundant enable signal generator 107 detects the voltage level at the node N1. The voltage level at the node N1 and the PREDE control signal are NANDed by the NAND gate 901 of FIG. 11 at point P3 and thus the redundant cell enable signal RED remains inactive at logic low which maintains the redundant memory cell array 109 in an inactive state.

If fuse F1 is cut, then the precharge voltage of the node N1 is maintained until another active row address signal is applied to RAn/RAnB. Since the voltage of the node N1 and the control signal PREDE are at a logic high, then the redundant enable signal generator 107 generates a redundant cell enable signal RED at a logic high level which activates the redundant memory cell array 109. Therefore, the redundant memory cell array 109 is replaced with a defective memory cell corresponding to the row address where only the row address signal RA0 is active.

As described above, during the burn-in stress test, the redundant enable signal generator 107 in the present invention is able to accurately detect the voltage of the node N1 and the operation of the redundant memory cell array 109 is accurately controlled.

According to the redundant controller of the integrated memory circuit of the present invention, during a burn-in stress test, the voltage of the node N1 of FIG. 3 is detected in either a discharged state or a precharge state to thereby accurately control the operational state of the redundant memory cell array 109. Therefore, the burn-in stress test is accurately performed on both a normal memory cell array and the redundant memory cell array to thereby improve the reliability of the integrated memory circuit which includes the redundant controller of the present invention.

It should be understood that the invention is not limited to the illustrated embodiments and that many changes and modifications can be made within the scope of the invention by a person skilled in the art.

What is claimed is:

1. A redundant memory cell control circuit comprising:

a decoder configured to receive a first set of row address signals and, responsive thereto, discharge an output terminal of the decoder;

a precharge enable unit coupled to the decoder and configured to precharge the output terminal of the decoder responsive to a precharge enable signal;

a redundant controller configured to receive a second set of row address signals and a stress signal, wherein the redundant controller is configured to generate a redundant control signal using a first enable path responsive to the second set of row address signals when the stress signal is absent and generate the redundant control signal using a second enable path responsive to the second set of row address signals when the stress signal is present such that the redundant control signal is generated after a predetermined delay when the stress signal is present; and a redundant enable signal generator coupled to the redundant controller and the decoder and configured to generate a redundant enable signal in response to the redundant control signal and a voltage level at the output terminal of the decoder.

2. The redundant memory cell control circuit of claim 1, wherein the decoder comprises:

a plurality of fuses each having first and second terminals, where the first terminal of each one of the plurality of fuses is coupled to the output terminal of the decoder; and a plurality of switches corresponding to the plurality of fuses, each one of the plurality of switches having first, second and control terminals, where the first terminal of each switch is coupled to the second terminal of a corresponding one of the plurality of fuses, the second terminal of each switch is coupled to a ground supply terminal and the control terminal of each switch being configured to receive one of the first set of row address signals.

3. The redundant memory cell control circuit of claim 1, wherein the stress signal corresponds to a burn-in test.

4. The redundant memory cell control circuit of claim 1, wherein the redundant controller further comprises:

a first logic circuit configured to receive the second set of row address signals and the stress signal and, when the stress signal is inactive, generate a first logic output signal responsive to the second set of row address signals;

a second logic circuit configured to receive the second set of row address signals and the stress signal and, when the stress signal is active, generate a second logic output signal responsive to the second set of row address signals;

a delay circuit configured to receive the second logic output signal and, responsive thereto, generate a delayed logic signal; and a third logic circuit configured to receive the first logic output signal and the delayed logic signal and, responsive thereto, generate the redundant control signal.

5. The redundant memory cell control circuit of claim 4, wherein:

the first logic circuit further comprises a first transmission gate configured to pass a combination of the second set of row address signals as the first logic output signal when the stress signal is inactive;

the second logic circuit further comprises a second transmission gate configured to pass the combination of the second set of row address signals as the second logic output signal when the stress signal is active; and the third logic circuit is a wired OR that combines the first logic output signal and the delayed logic signal to produce the redundant control signal.

6. A method for controlling a redundant memory cell in an integrated memory circuit, the method comprising the steps of:

precharging a circuit node responsive to a precharging signal;

discharging the circuit node responsive to a first set of row address signals;

generating a redundancy control signal responsive to a second set of row address signals;

sampling a logic level of the circuit node responsive to the redundancy control signal in order to generate a redundant memory cell enable signal; and delaying the redundancy control signal by a predetermined time interval responsive to a test signal.

7. A redundant memory cell controller circuit for an integrated memory cell device including a redundant memory cell, the redundant memory cell controller circuit comprising:

a precharge enable unit having first, second and control terminals, the control terminal of the precharge enable unit being configured to receive a precharge enable signal, the first terminal being coupled to a first power supply terminal and the second terminal of the precharge enable unit being coupled to a circuit node;

a decoder having a plurality of address input terminals configured to receive a first plurality of row address signals and an output terminal coupled to the circuit node, the decoder being configured to be programmable to discharge a voltage at the output terminal responsive to a first set of values of the first plurality of row address signals and to maintain the voltage at the output terminal responsive to a predetermined value of the first plurality of row address signals;

a redundant controller having a plurality of address input terminals configured to receive a second plurality of row address signals, a test control input terminal configured to receive a stress test signal, and an output terminal, the redundant controller being configured to generate a redundant control signal at the output terminal of the redundant controller responsive to the second plurality of row address signals, where the redundant control signal is delayed by a predetermined time interval responsive to the stress test signal; and a redundant enable signal generator having first and second input terminals and an output terminal, the first input terminal being coupled to the circuit node and the second input terminal being coupled to the output terminal of the redundant controller, where the redundant enable signal generator is configured to sample a voltage of the circuit node responsive to the redundant control signal in order to generate a redundant memory cell enable signal at the output terminal of the redundant enable signal generator.

8. The redundant memory cell controller circuit of claim 7, wherein the redundant controller further comprises:

a first logic circuit having a plurality of input terminals coupled to the plurality of input terminals of the redundant controller, a test input terminal coupled to the test control input terminal of the redundant controller, and an output terminal, the first logic circuit being configured to generate a first logic output signal at the output terminal of the first logic circuit responsive to the second plurality of row address signals when the stress test signal is at a first logic level;

a second logic circuit having a plurality of input terminals coupled to the plurality of input terminals of the redundant controller, a test input terminal coupled to the test control input terminal of the redundant controller, and an output terminal, the second logic circuit being configured to generate a second logic output signal at the output terminal of the second logic circuit responsive to the second plurality of row address signals when the stress test signal is at a second logic level;

a delay circuit having input and output terminals, the input terminal of the delay circuit being coupled to the output terminal of the first logic circuit; and a third logic circuit having first and second input terminals and an output terminal, the first input terminal of the third logic circuit being coupled to the output terminal of the delay circuit, the second input terminal of the third logic circuit being coupled to the output terminal of the second logic circuit and the output terminal of the third logic circuit being coupled to the output terminal of the redundant controller.

9. The redundant memory cell controller circuit of claim 8, wherein: the first logic circuit further comprises:

an invertor having an input terminal coupled to the test signal input terminal of the redundant controller, and a first NOR gate having a plurality of input terminals coupled to the plurality of input terminals of the redundant controller, an additional input terminal coupled to the output terminal of the invertor, and an output terminal coupled to the input terminal of the delay circuit;

the second logic circuit further comprises a second NOR gate having a plurality of input terminals coupled to the plurality of input terminals of the redundant controller, an additional input terminal coupled to the test control input terminal of the redundant controller, and an output terminal; and the third logic circuit further comprises a third NOR gate having first and second input terminals and an output terminal, the first input terminal of the third NOR gate being coupled to the output terminal of the delay circuit, the second input terminal of the third NOR gate being coupled to the output terminal of the second NOR gate, and the output terminal if the third NOR gate being coupled to the output terminal of the redundant controller.

10. The redundant memory cell controller circuit of claim 8, wherein: the first logic circuit further comprises:

an invertor having input and output terminals, the input terminal being coupled to the test control input terminal of the redundant controller, an OR gate having a plurality of input terminals and an output terminal, the plurality of input terminals of the OR gate being coupled to the plurality of input terminals of the redundant controller, and a first pass gate having inverting and non-inverting control terminals, an input terminal and an output terminal, the non-inverting control terminal being coupled to the test control input terminal of the redundant controller, the inverting control terminal being coupled to the output terminal of the invertor, the input terminal of the first pass gate being coupled to the output terminal of the OR gate, and the output terminal of the first pass gate being coupled to the input terminal of the delay unit;

the second logic circuit further comprises a second pass gate having inverting and non-inverting control terminals, an input terminal and an output terminal, the inverting control terminal of the second pass gate being coupled to the test control input terminal of the redundant controller, the non-inverting control terminal of the second pass gate being coupled to the output terminal of the invertor, the input terminal of the second pass gate being coupled to the output terminal of the OR gate; and the third logic circuit further comprises a wired-OR circuit node coupled to the output terminal of the delay circuit, the output terminal of the second pass gate, and the output terminal of the redundant controller.

11. The redundant memory cell controller circuit of claim 8, wherein: the first logic circuit further comprises:

an OR gate having a plurality of input terminals and an output terminal, the plurality of input terminals of the OR gate being coupled to the plurality of input terminals of the redundant controller, and a first NAND gate having first and second input terminals and an output terminal, the first input terminal of the first NAND gate being coupled to the output terminal of the OR gate, the second input terminal of the first NAND gate being coupled to the test control input terminal of the redundant controller, and the output terminal of the first NAND gate being coupled to the input of the delay circuit;

the second logic circuit further comprises: an invertor having input and output terminals, the input terminal of the invertor being coupled to the test control input terminal of the redundant controller, and a second NAND gate having first and second input terminals and an output terminal, the first input terminal of the second NAND gate being coupled to the output terminal of the OR gate and the second input terminal of the second NAND gate being coupled to the output terminal of the invertor; and the third logic circuit further comprises a third NAND gate having first and second input terminals and an output terminal, the first input terminal of the third NAND gate being coupled to the output terminal of the delay circuit, the second input terminal of the third NAND gate being coupled to the output terminal of the second NAND gate, and the output terminal of the third NAND gate being coupled to the output terminal of the redundant controller.

* * * * *